US012666985B2

(12) United States Patent
Foong et al.

(10) Patent No.: US 12,666,985 B2
(45) Date of Patent: Jun. 23, 2026

(54) SEMICONDUCTOR DEVICE WITH HYBRID ROUTING AND METHOD THEREFOR

(71) Applicant: NXP USA, INC., Austin, TX (US)

(72) Inventors: Chee Seng Foong, Austin, TX (US);
Trent Uehling, New Braunfels, TX
(US); Tingdong Zhou, Austin, TX
(US); Kristen LeAnne Mason, Austin,
TX (US)

(73) Assignee: NXP USA, Inc., Austin, TX (US)

( * ) Notice: Subject to any disclaimer, the term of this
patent is extended or adjusted under 35
U.S.C. 154(b) by 404 days.

(21) Appl. No.: 18/360,208

(22) Filed: Jul. 27, 2023

(65) Prior Publication Data

US 2025/0038092 A1 Jan. 30, 2025

(51) Int. Cl.
| | |
|---|---|
| *H10W 70/65* | (2026.01) |
| *H10W 70/05* | (2026.01) |
| *H10W 72/00* | (2026.01) |
| *H10W 72/20* | (2026.01) |
| *H10W 74/01* | (2026.01) |
| *H10W 74/10* | (2026.01) |
| *H10W 74/15* | (2026.01) |
| *H10W 90/00* | (2026.01) |

(52) U.S. Cl.
CPC ........... *H10W 70/65* (2026.01); *H10W 70/05*
(2026.01); *H10W 74/012* (2026.01); ***H10W
74/131* (2026.01); *H10W 74/15*** (2026.01);
*H10W 72/072* (2026.01); *H10W 72/07236*
(2026.01); *H10W 72/073* (2026.01); *H10W
72/252* (2026.01); *H10W 90/724* (2026.01);
*H10W 90/734* (2026.01)

(58) Field of Classification Search
CPC ... H10W 70/65; H10W 70/05; H10W 74/012;
H10W 74/131; H10W 74/15; H10W
72/072; H10W 72/07236; H10W 72/073;
H10W 72/252; H10W 90/724; H10W
90/734; H01L 2224/02126; H01L
2224/0215; H01L 2224/02235; H01L
2224/0226; H01L 2224/0236; H01L
2224/02371; H01L 2224/02377; H01L
2224/024; H01L 2224/03019; H01L
2224/0401; H01L 2224/05008; H01L
2224/05018; H01L 2224/05027; H01L
2224/05073; H01L 2224/05558; H01L
2224/05569; H01L 2224/05573; H01L
24/05
See application file for complete search history.

(56) References Cited

U.S. PATENT DOCUMENTS

| | | | |
|---|---|---|---|
| 7,901,983 B2 | 3/2011 | Pendse |
| 8,574,959 B1 | 11/2013 | Pendse |

(Continued)

*Primary Examiner* — Thanh T Nguyen

(57) ABSTRACT

A semiconductor device having hybrid routing is provided.
The semiconductor device includes a package substrate
having a first major side and a second major side. A plurality
of conductive bond-on-pad (BOP) pads and a plurality of
conductive bond-on-trace (BOT) pads are formed at the first
major side. A non-conductive layer is formed over the
plurality of BOP pads. Openings in the non-conductive layer
expose a central portion of each BOP pad of the plurality of
BOP pads. An inlet region is formed in the non-conductive
layer such that a first BOT pad of the plurality of BOT pads
is located within the inlet region.

11 Claims, 6 Drawing Sheets

500

(56) References Cited

U.S. PATENT DOCUMENTS

| 8,841,779 | B2 | 9/2014 | Pendse | |
| 9,064,858 | B2 | 6/2015 | Pendse | |
| 9,385,101 | B2 | 7/2016 | Pendse | |
| 9,545,013 | B2 | 1/2017 | Pendse | |
| 10,580,749 | B2 | 3/2020 | Pendse | |
| 10,957,664 | B2 | 3/2021 | Wu et al. | |
| 2005/0248037 | A1 | 11/2005 | Hung et al. | |
| 2006/0131758 | A1 | 6/2006 | Dao | |
| 2014/0346673 | A1* | 11/2014 | Lin | H01L 21/563 |
| | | | | 257/737 |
| 2018/0090460 | A1 | 3/2018 | Chu | |
| 2021/0066148 | A1* | 3/2021 | Kim | H01L 23/3128 |
| 2021/0167007 | A1 | 6/2021 | Chung et al. | |
| 2023/0299048 | A1* | 9/2023 | Sun | H01L 25/0657 |
| | | | | 257/621 |
| 2024/0387346 | A1* | 11/2024 | Tsao | H01L 23/49816 |

* cited by examiner

SEMICONDUCTOR DEVICE WITH HYBRID ROUTING AND METHOD THEREFOR

BACKGROUND

Field

This disclosure relates generally to semiconductor device packaging, and more specifically, to a semiconductor device having hybrid routing and method of forming the same.

Related Art

Today, there is an increasing trend to include sophisticated semiconductor devices in products and systems that are used every day. These sophisticated semiconductor devices may include features for specific applications which may impact the configuration of the semiconductor device packages, for example. With such features and applications, the configuration of the semiconductor device packages may limit performance of the semiconductor devices or impact the costs of the semiconductor devices. Accordingly, significant challenges exist in accommodating these features and applications while minimizing the impact on semiconductor devices' performance and costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device having hybrid routing. The semiconductor device includes a package substrate formed as a multi-layer laminate structure having conductive features such as metal traces, pads, and vias separated by a non-conductive material. The package substate includes a plurality of bond-on-trace pads (e.g., non-solder mask defined pads) and a plurality of bond-on-pad pads (e.g., solder mask defined pads) formed at a top side of the package substrate. The plurality of bond-on-pad pads are located in a first region of the package substrate substantially covered by a non-conductive layer having openings formed to expose central portions of the pads. The plurality of bond-on-trace pads connected trace portions are located in a second region adjacent to the first region of the package substrate substantially not covered by a non-conductive layer. Inlet regions are formed between bond-on-pad pads as extensions of the second region not covered by the non-conductive layer. By forming such inlet regions, exposed bond-on-trace pads may be interleaved among bond-on-pad pads thus forming a hybrid routing configuration. The hybrid routing configuration provides a higher pad density at the interface between the first and second regions, for example. Accordingly, the performance and cost of the semiconductor device may be improved by way of the hybrid routing configuration allowing for a smaller device package, for example.

Figure 1:
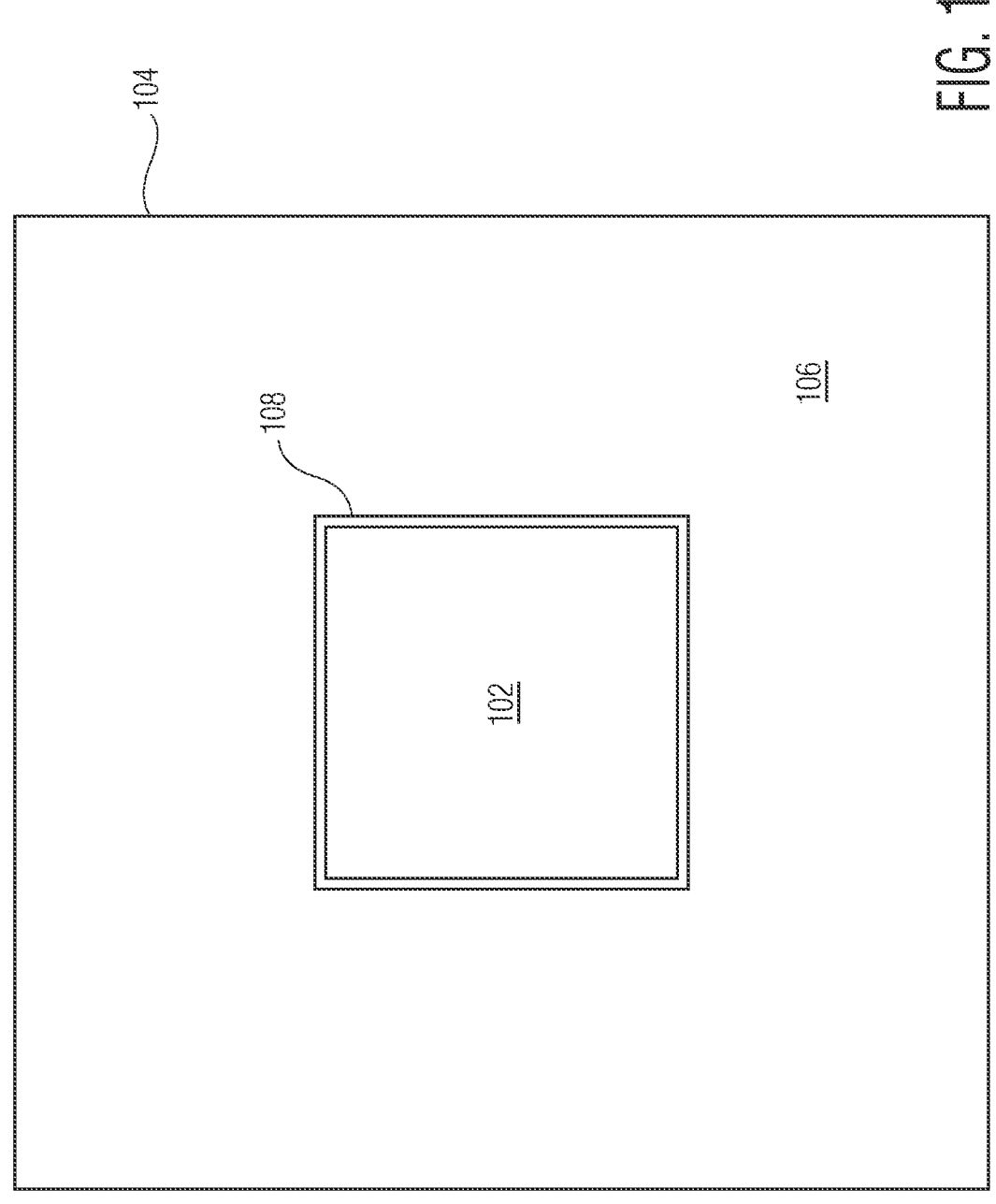
FIG. 1 illustrates, in a simplified top-side-up plan view, an example semiconductor device having hybrid routing at a stage of manufacture in accordance with an embodiment.
Figure 3:
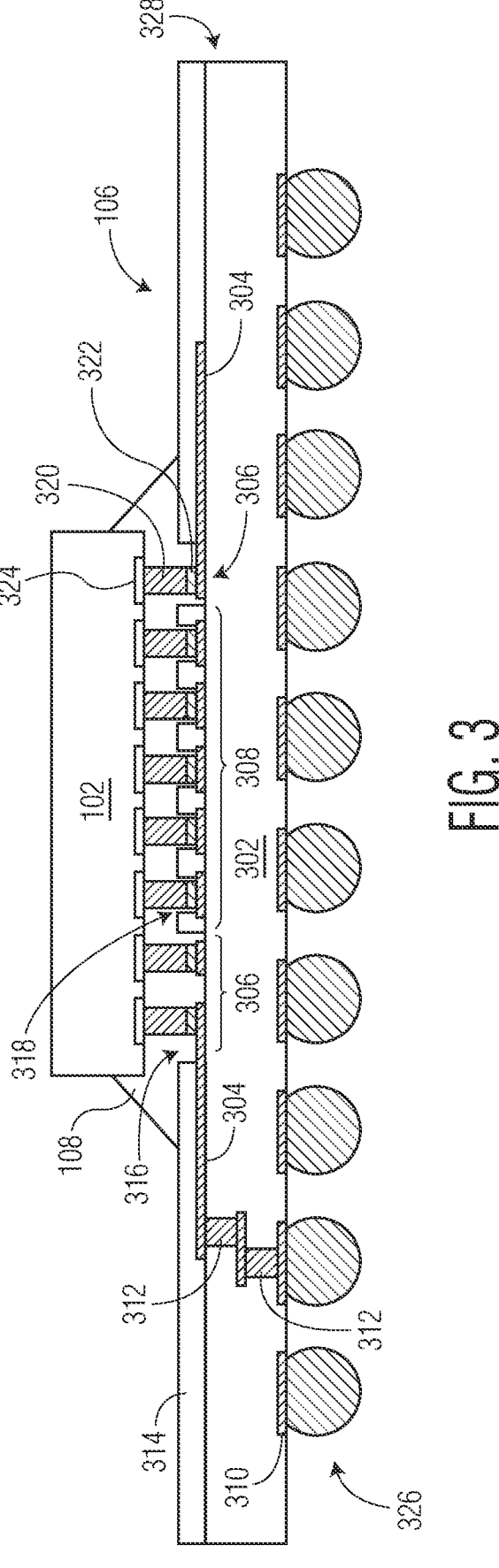
FIG. 3 illustrates, in a simplified cross-sectional view, the example semiconductor device with an alternative package substrate at a stage of manufacture in accordance with an embodiment.
Figure 4:
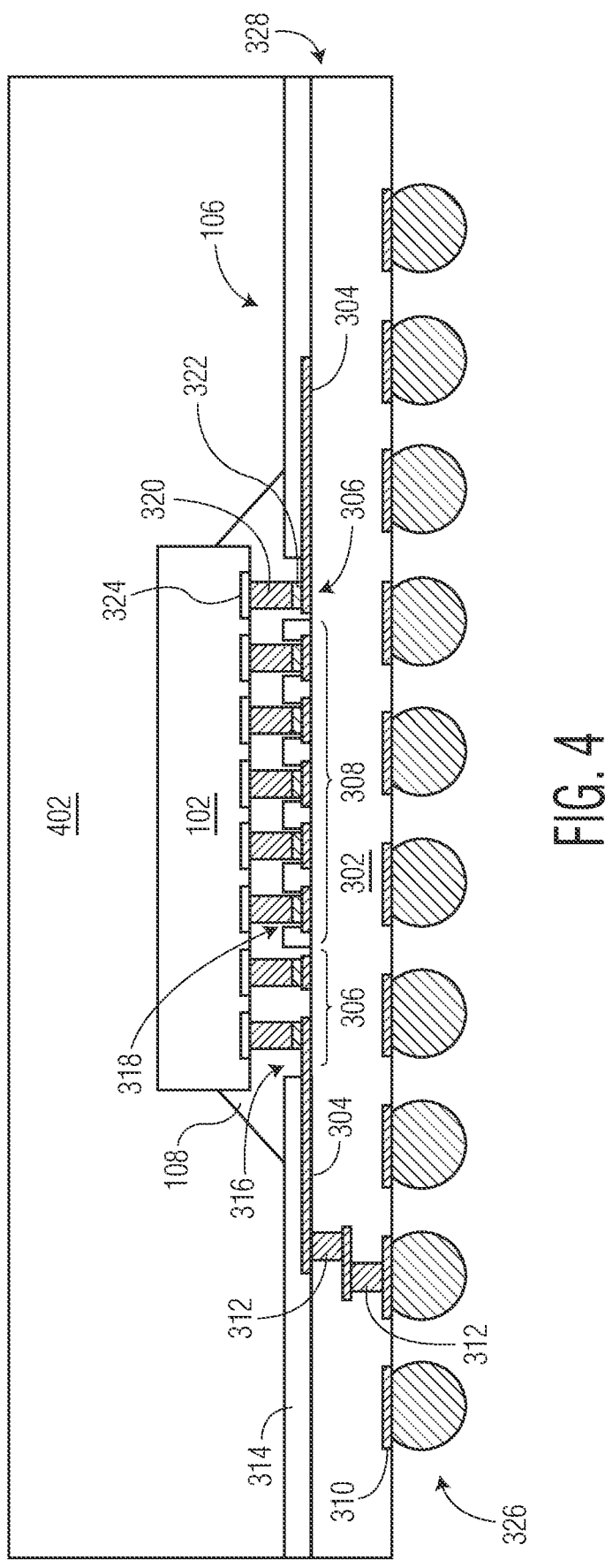
FIG. 4 illustrates, in a simplified cross-sectional view, the example semiconductor device at a subsequent stage of manufacture in accordance with an embodiment.

FIG. 1 illustrates, in a simplified top-side-up plan view, an example semiconductor device 100 having hybrid routing in accordance with an embodiment. At this stage, the device 100 includes a semiconductor die 102 mounted on a package substrate 104. The semiconductor die 102 is affixed to a top side 106 and interconnected with the package substrate 104 by way of conductive die connectors (not shown). The term "conductive" as used herein generally refers to electrical conductivity unless described otherwise. In this embodiment, a gap (not shown) between the semiconductor die 102 and the package substrate 104 is underfilled with an epoxy material 108. Cross-sectional views of examples of the semiconductor device 100 at stages of manufacture are depicted in FIG. 2 through FIG. 4.

The semiconductor die 102 has an active side (e.g., major side having circuitry, bond pads) and a backside (e.g., major side opposite of the active surface). As depicted in the top-side-up plan view of FIG. 1, the active side of the semiconductor die 102 is mounted on the package substrate 104 and interconnected utilizing bond pads (not shown) at the active side, for example. In this embodiment, the semiconductor die 102 is configured in a flip-chip orientation having the active side mounted on the package substrate 104. The semiconductor die 102 may be formed from any suitable semiconductor material, such as silicon, germanium, gallium arsenide, gallium nitride, and the like. Semiconductor die 102 may further include any digital circuits, analog circuits, RF circuits, power circuits, memory, processor, MEMs, sensor, the like, and combinations thereof at the active side.

The package substrate 104 has a top side 106 and a bottom side (e.g., major side opposite of the top side). As depicted in the top-side-up plan view of FIG. 1, the active side of the semiconductor die 102 is mounted at the top side 106 of the package substrate 104, for example. In this embodiment, conductive features such as metal traces and metal pads (not shown) at the top side 106 of the package substrate are interconnected with the semiconductor die 102.

Figure 2:
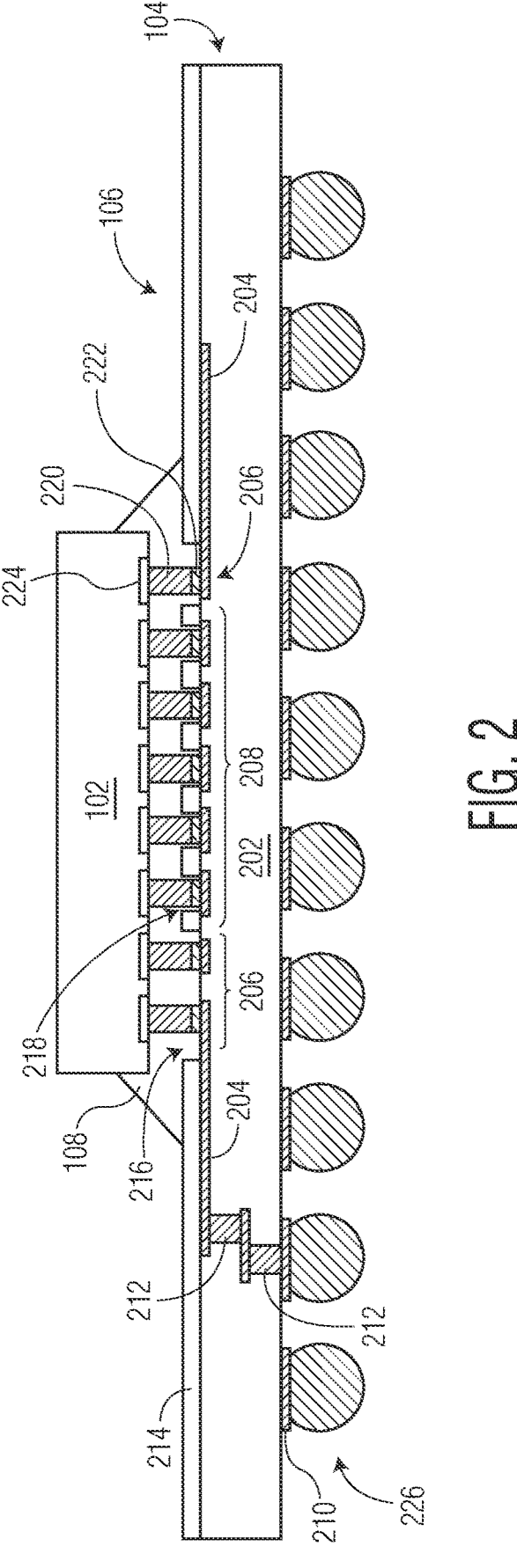
FIG. 2 illustrates, in a simplified cross-sectional view, the example semiconductor device at the stage of manufacture depicted in FIG. 1 in accordance with an embodiment.

FIG. 2 illustrates, in a simplified cross-sectional view, the example semiconductor device 100 at the stage of manufacture depicted in FIG. 1 in accordance with an embodiment. At this stage, the device 100 includes the active side of the semiconductor die 102 interconnected with the top side 106 of the package substrate 104 by way of conductive die connectors 220 and underfilled with the epoxy material 108. In this embodiment, bond pads 224 of the semiconductor die 102 are interconnected with a plurality of bond-on-trace (BOT) pads 206 and a plurality of bond-on-pad (BOP) pads 208 of the package substrate 104 by way of the conductive die connectors 220. The die connectors 220 may be any suitable die connector structure such as solder bumps, gold studs, copper pillars, and the like. In this embodiment, the die connectors 220 are formed as copper pillars with a solder capped portion 222.

The package substrate 104 is formed as a multi-layer laminate structure having conductive features (e.g., metal traces, pads, vias) separated by a non-conductive material (e.g., FR-4) 202. In this embodiment, the package substate 104 includes traces 204, BOT pads 206, and BOP pads 208 embedded at the top side of the package substrate 104 and connector pads 210 formed at the bottom side of the package substrate 104. The package substrate 104 may be characterized as a (coreless) embedded trace substrate. Vias 212 are configured to provide interlevel conductive connections between the traces 204, BOT pads 206, BOP pads 208 at the top side of the package substrate 104 and the connector pads 210 at the bottom side of the package substrate 104. The traces 204, BOT pads 206, BOP pads 208, and connector pads 210 may be formed from a suitable metal such as copper, for example. In this embodiment, the BOT pads 206 are formed as a widened region of exposed portions of the respective traces 204.

A non-conductive layer 214 is formed and patterned over the top side 106 of the package substrate 104. In this embodiment, the non-conductive layer 214 may be characterized as a solder resist or solder mask material. An open region 216 void of the non-conductive layer 214 exposes portions of traces 204 and the BOT pads 206 directly below the mounted semiconductor die 102. Similarly, openings 218 in the non-conductive layer 214 expose central portions of the BOP pads. A portion of the non-conductive layer 214 overlaps an outer portion of the BOP pads. In this embodiment, the gap between the semiconductor die 102 and the package substrate 104 is underfilled with the epoxy material 108 such that remaining exposed portions of the traces 204, BOT pads 206, and BOP pads 208 are covered by the epoxy material 108.

The conductive connectors 226 are affixed to the connector pads 210 at the bottom side of the package substrate 104. The conductive connectors 226 are configured to provide a conductive connection between the connector pads 210 of the package substrate 104 and a printed circuit board, for example. The conductive connectors 226 may be formed in any suitable conductive connector structures such as solder balls, gold studs, copper pillars, and the like. In this embodiment, the conductive connectors 226 are formed as ball connectors, for example, and arranged in a ball grid array (BGA).

FIG. 3 illustrates, in a simplified cross-sectional view, an example semiconductor device 300 with an alternative substrate type at the stage of manufacture depicted in FIG. 1 in accordance with an embodiment. At this stage, the device 300 includes the active side of the semiconductor die 102 interconnected with the top side 106 of the package substrate 328 by way of conductive die connectors 320 and underfilled with the epoxy material 108. In this embodiment, bond pads 324 of the semiconductor die 102 are interconnected with a plurality of BOT pads 306 and a plurality of BOP pads 308 of the package substrate 328 by way of the conductive die connectors 320. The die connectors 320 may be any suitable die connector structure such as solder bumps, gold studs, copper pillars, and the like. In this embodiment, the die connectors 320 are formed as copper pillars with a solder capped portion 322.

The package substrate 328 is formed as a multi-layer laminate structure having conductive features (e.g., metal traces, pads, vias) separated by a non-conductive material (e.g., FR-4) 302. In this embodiment, the package substate

328 includes traces 304, BOT pads 306, and BOP pads 308 formed on the top side of the package substrate 328 and connector pads 310 formed at the bottom side of the package substrate 328. The package substrate 328 may be characterized as a (cored) protruding trace substrate. Vias 312 are configured to provide interlevel conductive connections between the traces 304, BOT pads 306, BOP pads 308 at the top side 106 of the package substrate 328 and the connector pads 310 at the bottom side of the package substrate 328. The traces 304, BOT pads 306, BOP pads 308, and connector pads 310 may be formed from a suitable metal such as copper, for example. In this embodiment, the BOT pads 306 are formed as a widened region of exposed portions of the respective traces 304.

A non-conductive layer 314 is formed and patterned over the top side 106 of the package substrate 328. In this embodiment, the non-conductive layer 314 may be characterized as a solder resist or solder mask material. An open region 316 void of the non-conductive layer 314 exposes portions of traces 304 and the BOT pads 306 directly below the mounted semiconductor die 102. Similarly, openings 318 in the non-conductive layer 314 expose central portions of the BOP pads 308. A portion of the non-conductive layer 314 overlaps an outer portion of the BOP pads. In this embodiment, the gap between the semiconductor die 102 and the package substrate 328 is underfilled with the epoxy material 108 such that remaining exposed portions of the traces 304, BOT pads 306, and BOP pads 308 are covered by the epoxy material 108.

Conductive connectors 326 are affixed to the connector pads 310 at the bottom side of the package substrate 328. The conductive connectors 326 are configured to provide a conductive connection between the connector pads 310 of the package substrate 328 and a printed circuit board, for example. The conductive connectors 326 may be formed in any suitable conductive connector structures such as solder balls, gold studs, copper pillars, and the like. In this embodiment, the conductive connectors 326 are formed as ball connectors, for example, and arranged in a BGA.

FIG. 4 illustrates, in a simplified cross-sectional view, an example semiconductor device 400 depicted as the semiconductor device of FIG. 3 at a subsequent stage of manufacture in accordance with an embodiment. At this stage, the device 400 includes the semiconductor die 102 mounted on the package substrate 328 and encapsulated with an encapsulant 402. In this embodiment, a top portion of the semiconductor device 400 is over-molded with the encapsulant 402 by way of a molding process. The encapsulant 402 may be an epoxy molding compound (EMC) dispensed during an injection or transfer molding encapsulation operation, for example.

In this embodiment, the encapsulant 402 covers exposed portions of the package substrate, underfill material 108, and semiconductor die 102. In some embodiments, as an alternative to the encapsulant 402, a glob top resin coating, cap, lid, or other encapsulation method and/or material may be utilized. Even though the embodiment of FIG. 4 is depicted with the package substrate 328 configured as a protruding trace substrate, embodiments in other configurations such as the package substrate 104 of FIG. 2 configured as an embedded trace substrate are anticipated by this disclosure.

Figure 5:
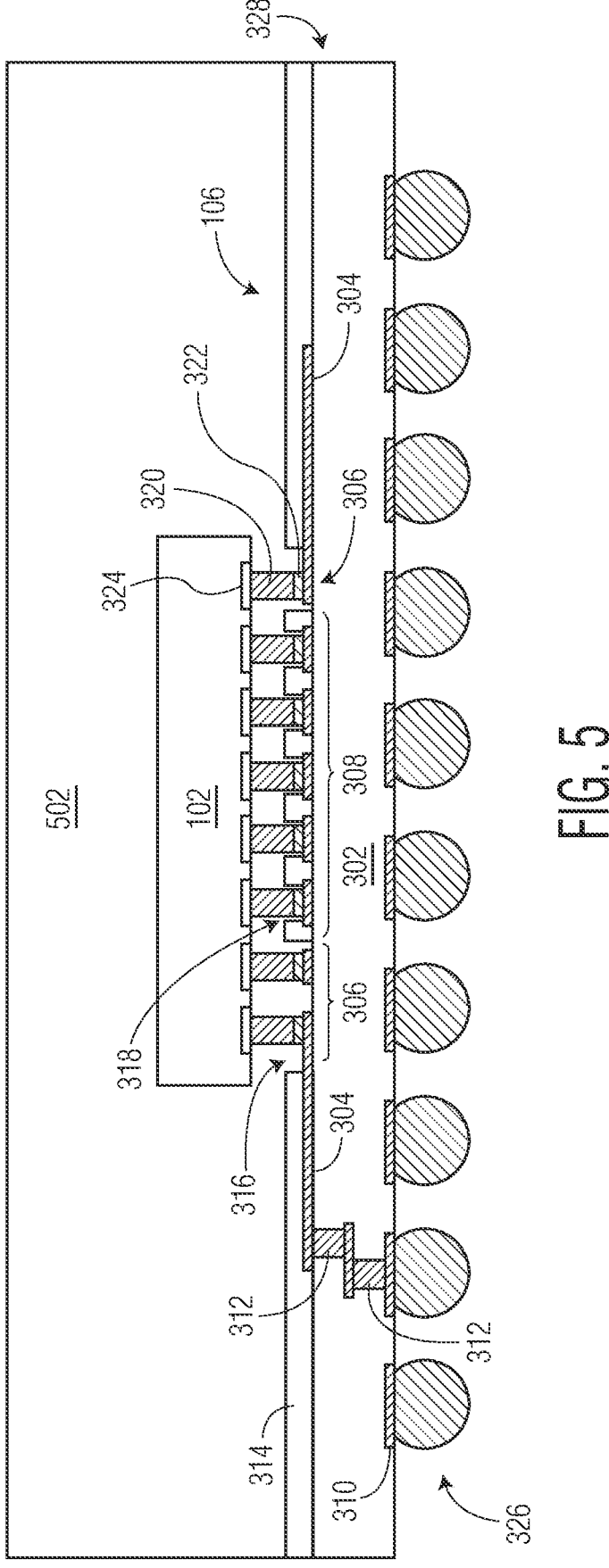
FIG. 5 illustrates, in a simplified cross-sectional view, an alternative example semiconductor device at a stage of manufacture in accordance with an embodiment.

FIG. 5 illustrates, in a simplified cross-sectional view, an example semiconductor device 500 depicted at a stage of manufacture in accordance with an embodiment. The embodiment illustrated in FIG. 5 is substantially similar to the embodiment of FIG. 4 without the underfill material 108 disposed in the gap between the semiconductor die 102 and the package substrate 328, for example. At this stage, the device 500 includes the semiconductor die 102 mounted on the package substrate 328 and encapsulated with an encapsulant 502. In this embodiment, a top portion of the semiconductor device 500 is over-molded with the encapsulant 502 by way of a molding process. The encapsulant 502 may be an EMC dispensed during an injection or transfer molding encapsulation operation, for example.

In this embodiment, the encapsulant 502 covers exposed portions of the package substrate and semiconductor die 102 and fills the gap between the semiconductor die 102 and the package substrate 328. Even though the embodiment of FIG. 5 is depicted with the package substrate 328 configured as a protruding trace substrate, embodiments in other configurations such as the package substrate 104 of FIG. 2 configured as an embedded trace substrate are anticipated by this disclosure.

Figure 6:
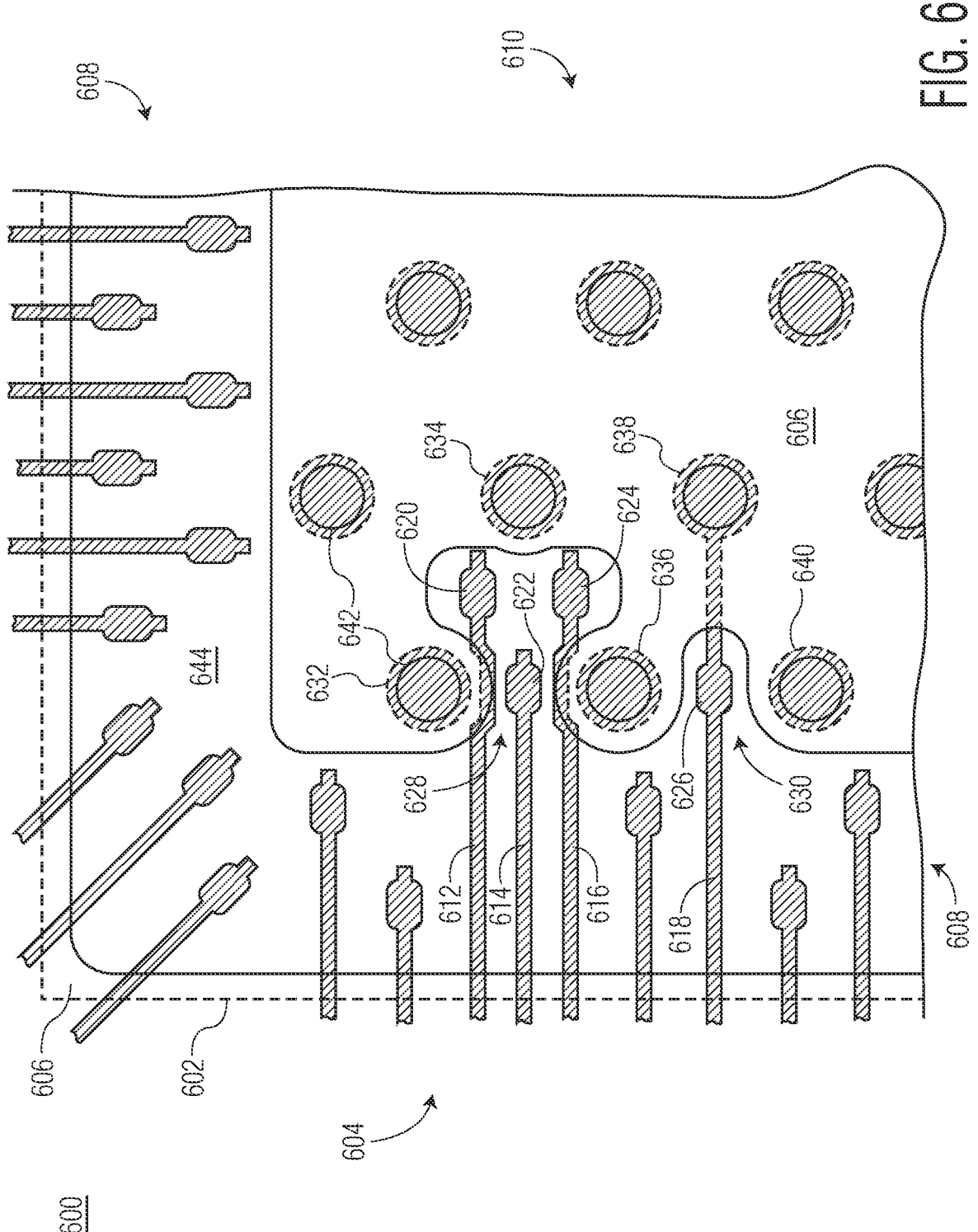
FIG. 6 illustrates, in a simplified top-side-up plan view, a portion of a package substrate of the example semiconductor device at a stage of manufacture in accordance with an embodiment.

FIG. 6 illustrates, in a simplified top-side-up plan view, a portion of a package substrate 604 of an example semiconductor device 600 at a stage of manufacture in accordance with an embodiment. At this stage, the device 600 includes the package substrate 604 before attachment of the semiconductor die 602 (depicted as a dashed outline for illustration purposes). The package substrate 604 has a top surface 644 at the top side (e.g., corresponding to the top side 106 of FIG. 2 and FIG. 3) and a non-conductive layer 606 (e.g., corresponding to the non-conductive layers 214, 314 of FIG. 2 and FIG. 3) formed and patterned over the top surface 644 of the package substrate. In this embodiment, the non-conductive layer 606 may be characterized as a solder resist or solder mask material.

In this embodiment, the package substrate 604 includes a BOT region 608 having a plurality of BOT pads and a BOP region 610 having a plurality of BOP pads. The plurality of BOT pads in the BOT region 608 are arranged in a higher density than the plurality of BOP pads in the BOP region 610. In this embodiment, each of the BOT pads of the BOT region 608 and each of the BOP pads of the BOP region 610 are configured as connection sites for conductively connecting to a semiconductor die by way of conductive die connectors at a subsequent stage of manufacture.

The BOT region 608 includes the plurality of BOT pads (e.g., pads 620, 622, 624, 626) and portions of conductive traces (e.g., traces 612, 614, 616, 618) connected to respective BOT pads. The plurality of BOT pads and portions of the respective traces in the BOT region 608 are exposed (e.g., not covered by the non-conductive layer 606) at the top surface 644 of the package substrate 604. In this embodiment, the BOT pads may be characterized as non-solder mask defined (NSMD) pads.

The BOP region 610 includes the plurality of BOP pads (e.g., pads 632, 634, 636, 638, 640) partially exposed by way of openings 642 in the non-conductive layer 606 on the package substrate 604. The openings 642 expose a central region of each BOP pad while leaving a region proximate to the outer perimeter of each BOP pad cover by the non-conductive layer 606. In this embodiment, the BOP pads may be characterized as solder mask defined (SMD) pads.

In this embodiment, inlet regions 628 and 630 are formed as extensions of the BOT region 608 not covered by the non-conductive layer 606. The inlet regions 628 and 630 are configured to expose BOT pads located between BOP pads of the plurality of BOP pads in the BOP region 610. For example, the inlet region 628 is formed substantially in an area located between BOP pads 632, 634, and 636, and the inlet region 630 is formed substantially in an area located between BOP pads 636 and 640. In this embodiment, exposed BOT pad 620 is located between BOP pads 632 and 634, exposed BOT pad 622 is located between BOP pads 632 and 636, and exposed BOT pad 624 is located between BOP pads 634 and 636. Accordingly, each of the BOT pads 620, 622, 624, and 626 located in respective inlet regions 628 and 630 is flanked on at least two sides by the non-conductive layer 606. In this embodiment, the BOT pad 626 and the BOP pad 638 are interconnected by way of the conductive trace 618 allowing for multiple connections to a signal trace or power supply trace, for example. The size, shape, arrangement, and number of the BOP pads of the BOP region 610 and the BOT pads with respective traces of the BOT region 608 in this embodiment are chosen for illustration purposes.

By forming such inlet regions, exposed BOT pads such as pads 620, 622, 624, and 626 can be located among BOP pads in a region of the package substrate conventionally characterized as a BOP region such as BOP region 610. In this embodiment, the BOT pads 622 and 626 are interleaved with the BOP pads 632, 636, and 640 to form a hybrid routing configuration. The hybrid routing configuration formed by interleaving BOT pads with BOP pads provides a higher pad density at the interface between the BOT region 608 and the BOP region 610, for example. Accordingly, smaller device package substrates can be realized for a given number of I/O and power connections, or a larger number of I/O and power connections can be accommodated without increasing sizes of device package substrates. In addition, the BOT pad locations may be configured closer to respective die pads of a semiconductor die, for example, allowing critical signal traces and power supply traces to have substantially lower impedances.

Generally, there is provided, a semiconductor device including a package substrate having a first major side and a second major side; a plurality of conductive bond-on-pad (BOP) pads formed at the first major side; a non-conductive layer formed over the plurality of BOP pads, openings in the non-conductive layer expose a central portion of each BOP pad of the plurality of BOP pads; a plurality of conductive bond-on-trace (BOT) pads formed at the first major side; and an inlet region formed in the non-conductive layer, a first BOT pad of the plurality of BOT pads located within the inlet region. The first BOT pad may be located between a first BOP pad of the plurality of BOP pads and a second BOP pad of the plurality of BOP pads. The first BOT pad located within the inlet region may be substantially flanked on two sides by the non-conductive layer. The non-conductive layer may be characterized as a solder resist material. The first BOT pad located within the inlet region may be directly connected to a first BOP pad of the plurality of BOP pads by way of a conductive trace formed at the first major side of the package substrate. The semiconductor device may further include a semiconductor die mounted on the first major side of the package substrate, the semiconductor die overlaying the plurality of BOP pads and the plurality of BOT pads. The semiconductor device may further include an underfill material disposed between the semiconductor die and the first major side of the package substrate. The bond pads of the semiconductor die may be connected to the underlying plurality of BOP pads and plurality of BOT pads by way of conductive die connectors. The die connectors may be characterized as solder-tipped copper pillars.

In another embodiment, there is provided, a method including forming a plurality of conductive bond-on-pad (BOP) pads at a first major side of a package substrate; forming a plurality of conductive bond-on-trace (BOT) pads at the first major side of the package substrate; depositing a non-conductive layer over the plurality of BOP pads; forming openings in the non-conductive layer such that a central portion of each BOP pad of the plurality of BOP pads is exposed; and forming an inlet region in the non-conductive layer such that a first BOT pad of the plurality of BOT pads is located within the inlet region. The first BOT pad may be located between a first BOP pad of the plurality of BOP pads and a second BOP pad of the plurality of BOP pads. The first BOT pad located within the inlet region may be substantially flanked on two sides by the non-conductive layer. The first BOT pad located within the inlet region may be directly connected to a first BOP pad of the plurality of BOP pads by way of a conductive trace formed at the first major side of the package substrate. The method may further include affixing a semiconductor die on the first major side of the package substrate and connecting bond pads of the semiconductor die to the plurality of BOP pads and plurality of BOT pads by way of conductive die connectors. The method may further include injecting an underfill material between the semiconductor die and the first major side of the package substrate.

In yet another embodiment, there is provided, a method including forming a plurality of conductive bond-on-pad (BOP) pads at a first major side of a package substrate; forming a plurality of conductive bond-on-trace (BOT) pads at the first major side of the package substrate; depositing a non-conductive layer over the plurality of BOP pads; forming openings in the non-conductive layer such that a central portion of each BOP pad of the plurality of BOP pads is exposed; forming an inlet region in the non-conductive layer such that a first BOT pad of the plurality of BOT pads is located within the inlet region; and affixing a semiconductor die on the first major side of the package substrate, the semiconductor die overlaying the plurality of BOP pads and the plurality of BOT pads. The first BOT pad may be located between a first BOP pad of the plurality of BOP pads and a second BOP pad of the plurality of BOP pads. The forming the inlet region in the non-conductive layer may further include a second BOT pad of the plurality of BOT pads located within the inlet region between the first BOP pad of the plurality of BOP pads and a third BOP pad of the plurality of BOP pads. The first BOT pad located within the inlet region may be substantially flanked on three sides by the non-conductive layer. The method may further include forming a plurality of connector pads at a second major side of the package substrate, a first connector pad of the plurality of connector pads interconnected with the first BOT pad by way of the package substrate.

By now, it should be appreciated that there has been provided a semiconductor device having hybrid routing. The semiconductor device includes a package substrate formed as a multi-layer laminate structure having conductive features such as metal traces, pads, and vias separated by a non-conductive material. The package substate includes a plurality of bond-on-trace pads (e.g., NSMD pads) and a plurality of bond-on-pad pads (e.g., SMD pads) formed at a top side of the package substrate. The plurality of bond-on-pad pads are located in a first region of the package substrate substantially covered by a non-conductive layer having openings formed to expose central portions of the pads. The plurality of bond-on-trace pads connected trace portions are located in a second region adjacent to the first region of the package substrate substantially not covered by a non-conductive layer. Inlet regions are formed between bond-on-pad pads as extensions of the second region not covered by the non-conductive layer. By forming such inlet regions, exposed bond-on-trace pads may be interleaved among bond-on-pad pads thus forming a hybrid routing configuration. The hybrid routing configuration provides a higher pad density at the interface between the first and second regions, for example. Accordingly, the performance and cost of the semiconductor device may be improved by way of the hybrid routing configuration allowing for a smaller device package, for example.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   forming a plurality of conductive bond-on-pad (BOP) pads at a first major side of a package substrate;
   forming a plurality of conductive bond-on-trace (BOT) pads at the first major side of the package substrate;
   depositing a non-conductive layer over the plurality of BOP pads;
   forming openings in the non-conductive layer such that a central portion of each BOP pad of the plurality of BOP pads is exposed; and
   forming an inlet region in the non-conductive layer such that a first BOT pad of the plurality of BOT pads is located within the inlet region.

2. The method of claim 1, wherein the first BOT pad is located between a first BOP pad of the plurality of BOP pads and a second BOP pad of the plurality of BOP pads.

3. The method of claim 1, wherein the first BOT pad located within the inlet region is substantially flanked on two sides by the non-conductive layer.

4. The method of claim 1, wherein the first BOT pad located within the inlet region is directly connected to a first BOP pad of the plurality of BOP pads by way of a conductive trace formed at the first major side of the package substrate.

5. The method of claim 1, further comprising:

affixing a semiconductor die on the first major side of the package substrate; and connecting bond pads of the semiconductor die to the plurality of BOP pads and plurality of BOT pads by way of conductive die connectors.

6. The method of claim 5, further comprising injecting an underfill material between the semiconductor die and the first major side of the package substrate.

7. A method comprising:

forming a plurality of conductive bond-on-pad (BOP) pads at a first major side of a package substrate;

forming a plurality of conductive bond-on-trace (BOT) pads at the first major side of the package substrate;

depositing a non-conductive layer over the plurality of BOP pads;

forming openings in the non-conductive layer such that a central portion of each BOP pad of the plurality of BOP pads is exposed;

forming an inlet region in the non-conductive layer such that a first BOT pad of the plurality of BOT pads is located within the inlet region; and affixing a semiconductor die on the first major side of the package substrate, the semiconductor die overlaying the plurality of BOP pads and the plurality of BOT pads.

8. The method of claim 7, wherein the first BOT pad is located between a first BOP pad of the plurality of BOP pads and a second BOP pad of the plurality of BOP pads.

9. The method of claim 8, wherein forming the inlet region in the non-conductive layer further includes a second BOT pad of the plurality of BOT pads located within the inlet region between the first BOP pad of the plurality of BOP pads and a third BOP pad of the plurality of BOP pads.

10. The method of claim 7, wherein the first BOT pad located within the inlet region is substantially flanked on three sides by the non-conductive layer.

11. The method of claim 7, further comprising forming a plurality of connector pads at a second major side of the package substrate, a first connector pad of the plurality of connector pads interconnected with the first BOT pad by way of the package substrate.

* * * * *